US011719392B2

(12) United States Patent
Van Bommel et al.

(10) Patent No.: US 11,719,392 B2
(45) Date of Patent: Aug. 8, 2023

(54) LED FILAMENT LAMP THAT COMBINES THE ADVANTAGES OF LED LIGHTING WITH THE ATTRACTIVENESS AND APPEAL OF LIGHT EMITTED FROM A CANDLE

(71) Applicant: SIGNIFY HOLDING B.V., Eindhoven (NL)

(72) Inventors: Ties Van Bommel, Horst (NL); Robert Jacob Pet, Waalre (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/761,098

(22) PCT Filed: Sep. 11, 2020

(86) PCT No.: PCT/EP2020/075526
§ 371 (c)(1),
(2) Date: Mar. 16, 2022

(87) PCT Pub. No.: WO2021/052887
PCT Pub. Date: Mar. 25, 2021

(65) Prior Publication Data
US 2022/0349530 A1    Nov. 3, 2022

(30) Foreign Application Priority Data

Sep. 18, 2019    (EP) ..................................... 19197924

(51) Int. Cl.
*F21K 9/232*    (2016.01)
*F21K 9/64*    (2016.01)
(Continued)

(52) U.S. Cl.
CPC ................. *F21K 9/232* (2016.08); *F21K 9/64* (2016.08); *H01L 25/0753* (2013.01); *F21Y 2103/10* (2016.08); *F21Y 2115/10* (2016.08)

(58) Field of Classification Search
CPC . F21K 9/232; F21K 9/64; F21K 9/235; F21K 9/238; F21K 9/60; H01L 25/0753;
(Continued)

(56) References Cited

U.S. PATENT DOCUMENTS

2018/0045379 A1    2/2018  Jiang
2019/0086036 A1    3/2019  Hofmann et al.
(Continued)

FOREIGN PATENT DOCUMENTS

CN        102537754 A    7/2012
CN        203628400 U    6/2014
(Continued)

*Primary Examiner* — Tracie Y Green

(57) ABSTRACT

There is provided a light emitting diode, LED, filament lamp (100) which provides LED filament lamp light (100'). The LED filament lamp (100) comprises at least one LED filament (101) which has a LED filament length (L) which extends from a first end (1003) to a second end (1004). The at least one LED filament (101) provides LED filament light (101) and comprises an array (102) of a plurality of LEDs (103) and an encapsulant (104). The array (102) of a plurality of LEDs (103) provide LED light (103') and extend along the LED filament length (L). The encapsulant (104) is at least partially enclosing the plurality of LEDs (103). The encapsulant (104) comprises a light scattering material (105). In the direction from the first end (1003) to the second end (1004) at least one of (i) the thickness (TL) of the encapsulant (104), and (ii) the concentration (CL) of the light scattering material (105) in the encapsulant (104), along the LED filament length (L) increases over at least two adjacent first LEDs (106) and decreases over at least two adjacent second LEDs (107) different from the at least two
(Continued)

adjacent first LEDs (106), and wherein the thickness (TL) and/or concentration (CL) firstly increases and secondly decreases at least along a portion of the LED filament length (L).

13 Claims, 5 Drawing Sheets

(51) Int. Cl.
    *H01L 25/075*      (2006.01)
    *F21Y 103/10*      (2016.01)
    *F21Y 115/10*      (2016.01)

(58) Field of Classification Search
    CPC .................. H01L 33/54; H01L 33/505; H01L 2933/0091; F21Y 2103/10; F21Y 2115/10
    See application file for complete search history.

(56) References Cited

U.S. PATENT DOCUMENTS

| | | |
|---|---|---|
| 2019/0088836 A1 | 3/2019 | Sweegers et al. |
| 2019/0113181 A1 | 4/2019 | Schlereth et al. |
| 2019/0178452 A1* | 6/2019 | Kim .................. H01L 33/52 |
| 2019/0191516 A1* | 6/2019 | Li .................... H05B 33/14 |
| 2019/0242532 A1* | 8/2019 | Jiang ................ F21K 9/232 |

FOREIGN PATENT DOCUMENTS

| | | |
|---|---|---|
| CN | 107314258 A | 11/2017 |
| DE | 102016105211 A1 | 9/2017 |
| DE | 102016115533 A1 | 2/2018 |
| KR | 20130019389 A | 2/2013 |
| WO | 2019129035 A1 | 7/2019 |

\* cited by examiner

LED FILAMENT LAMP THAT COMBINES THE ADVANTAGES OF LED LIGHTING WITH THE ATTRACTIVENESS AND APPEAL OF LIGHT EMITTED FROM A CANDLE

CROSS-REFERENCE TO PRIOR APPLICATIONS

This application is the U.S. National Phase application under 35 U.S.C. § 371 of International Application No. PCT/EP2020/075526, filed on Sep. 11, 2020, which claims the benefit of European Patent Application No. 19197924.4, filed on Sep. 18, 2019. These applications are hereby incorporated by reference herein.

FIELD OF THE INVENTION

The present invention relates to a LED filament lamp which comprises at least one LED filament. The present invention further relates to a luminaire comprising a reflector and said LED filament lamp.

BACKGROUND OF THE INVENTION

The use of light emitting diodes (LED) for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

In particular, there is currently a very large interest in lighting devices and/or arrangements (such as lamps) provided with LEDs, and incandescent lamps are rapidly being replaced by LED-based lighting solutions. It is nevertheless appreciated and desired to have retrofit lighting devices (e.g. lamps) which have the look of an incandescent lamp. For this purpose, it is possible to make use of the infrastructure for producing incandescent lamps based on LED filaments arranged in such a bulb. However, the light generated by LED filament lamps may, for some applications, appear static, "cold" and/or unattractive.

Candles, on the other hand, are able to generate light which is highly attractive and appealing. Light emitted from the open flame of a candle may, compared to light emitted from LEDs and/or incandescent lamps, appear more vivid, sparkling, "warm", aesthetic and/or romantic. However, one of the major disadvantages of the use of candles is the risk of fire associated with an open flame.

Hence, it is an object of the present invention to try to overcome the respective disadvantages of candles, on the one hand, and light emitted from LED filaments, on the other hand, by exploring the possibility of combing one or more of the respective advantages of candlelight and LED lighting devices.

US 2019/0113181 A1 discloses a filament which includes a multiplicity of light-emitting semiconductor chips, wherein the semiconductor chips are arranged on a carrier, the semiconductor chips being electrically contacted, a scattering structure is configured to scatter light of the light-emitting semiconductor chips, the scattering structure is formed by structuring a surface, a converter covers the light-emitting semiconductor chips, and the structuring of the surface is formed on a surface of the converter.

DE 10 2016 105211 A1 discloses a filament with a radiation-permeable substrate, a plurality of light-emitting diodes (LEDs) and a converter layer. The LEDs being arranged on the substrate and the converter layer covering the LEDs and the substrate. The converter layer on an upper side of the substrate has a first partial layer and a second partial layer on an underside of the substrate. The converter layer is set up to achieve an improved radiation profile of the filament such that—the converter layer has a varying vertical layer thickness along a lateral direction, and/or—the first partial layer and the second partial layer differentiate from one another with regard to their geometry and/or their material composition.

US 2018/045379 A1 discloses an LED filament. The LED filament includes LED chips, two conductive electrodes, conductive wires, an enclosure coating, and one or more auxiliary piece. The LED chips are arranged in an array and electrically connected with one another. The two conductive electrodes are corresponding to the array. Each of the two conductive electrodes is electrically connected to a corresponding LED chip at an end of the array. The conductive wires electrically connect the LED chips and the two conductive electrodes. The conductive wires are respectively between every two adjacent LED chips of the array and between each of the two conductive electrodes and the corresponding LED chip at an end of the array. The enclosure coating is on two or more sides of the array and the two conductive electrodes. A portion of each of the two conductive electrodes is exposed from the enclosure. The auxiliary piece is disposed in the enclosure coating and overlaps one of the conductive wires between each of the two conductive electrodes and the corresponding one of the two LED chips respectively at two ends of the array on a radial direction of the LED filament.

WO 2019/129035 A1 discloses An LED filament. The LED filament comprises at least one LED section, a conductive section, two conductive electrodes and a light conversion layer. The conductive section is used to electrically connect two adjacent LED sections. The two conductive electrodes are electrically connected to each of the LED sections. Each of the LED sections includes at least two LED chips electrically connected to each other. The light conversion layer covers the LED sections, the conductive sections and the conductive electrodes, and a part of the two electrodes is exposed respectively. Since the LED filament includes the LED section and the conductive section, when the LED filament is bent, the stress is easily concentrated on the conductive section. Therefore, the breakage probability of the conductive wires connected within the LED section is reduced during bending. The quality of the LED filament and its application is improved.

DE 10 2016 115533 A1 discloses an optoelectronic semiconductor chip. The optoelectronic semiconductor chip has the following features: a semiconductor layer sequence with a plurality of pixels which has an active layer which is suitable for generating electromagnetic radiation of a first wavelength range, and a large number of conversion elements, each conversion element being suitable for converting radiation of the first wavelength range into radiation of a second wavelength range. Each pixel having a radiation exit area and a conversion element on each radiation exit area is arranged. Each conversion element has a greater thickness in a central area than in an edge area. Furthermore, a method for producing an optoelectronic semiconductor chip and a headlight with an optoelectronic semiconductor chip are described.

SUMMARY OF THE INVENTION

Hence, it is of interest to explore the possibility of combining one or more of the numerous advantages of LED lighting devices with the attractiveness and the appealing properties of light emitted from a candle.

This and other objects are achieved by providing a LED filament lamp having the features in the independent claim. Preferred embodiments are defined in the dependent claims.

Hence, according to the present invention, there is provided a LED filament lamp. The LED filament lamp provides LED filament lamp light and comprises at least one LED filament. The at least one LED filament has a LED filament length. The at least one LED filament provides LED filament light and comprises an array of a plurality of LEDs and an encapsulant. The array of the plurality of LEDs provides LED light and extends along the LED filament length. The encapsulant at least partially encloses the plurality of LEDs. The encapsulant comprises a light scattering material. At least one of (i) the thickness of the encapsulant, and (ii) the concentration of the light scattering material in the encapsulant, along the LED filament length increases over at least two adjacent first LEDs and decreases over at least two adjacent second LEDs different from the at least two adjacent first LEDs. The thickness and/or concentration firstly increases and secondly decreases at least along a portion of the LED filament length.

Thus, the present invention is based on the idea of providing a LED filament lamp wherein the appearance of the LED filament(s) of the LED filament lamp and/or the light emitted from the LED filament lamp during its operation may resemble or mimic that of a candle. Furthermore, by the features of the LED filament lamp, the lamp is furthermore able to combine one or more of the numerous advantages of LED lighting devices with the attractiveness and the appealing properties of light emitted from a candle.

The present invention is advantageous in that properties of the LED filament(s) of the LED filament lamp may lead to a generation of light which may resemble or mimic the relatively vivid, sparkling, "warm", aesthetic and/or romantic light of an open flame of a candle. The reason is that the LED filament has a variable diffuser along the length of the LED filament.

The present invention is further advantageous in that the LED filament lamp may combine the aesthetic features of candlelight with the incontestable safety of operating an electric light compared to that of a light source having an open flame.

The present invention is further advantageous in that the LED filament lamp has a much longer operational life compared to that of a candle. Hence, it is much more convenient and/or cost-efficient to operate a LED filament lamp instead of a candle.

It will be appreciated that the LED filament lamp of the present invention furthermore comprises relatively few components. The low number of components is advantageous in that the LED filament lamp is relatively inexpensive to fabricate. Moreover, the low number of components of the LED filament lamp implies an easier recycling, especially compared to devices or arrangements comprising a relatively high number of components which impede an easy disassembling and/or recycling operation.

One or more of the above mentioned effects are achieved because the light intensity of the LED filament light decreases and increases respectively over said first LEDs and said second LEDs at least along a portion of the LED filament length (L), such that the light intensity (LI) of the LED filament light (101') varies along said portion of the LED filament length (L). The light intensity may be defined as the number of photons per area.

A LED filament (lamp), for example, disclosed in US 2019/0113181 A1 is unable to provide decorative lighting with improved decorative look and/or appearance. The reason is that the light emitted from such a LED filament does not vary along said portion (from one LED area to another LED area) of the LED filament length (L).

According to an embodiment of the present invention, the at least one LED filament may comprise a carrier e.g. a substrate. The array of the plurality of LEDs may be arranged on a first surface of the carrier.

According to an embodiment of the present invention, an array of a plurality of LEDs may be arranged on a second surface of the carrier, opposite to said first surface.

According to an embodiment of the present invention, an encapsulant is arranged on the second surface of the carrier.

According to an embodiment of the present invention, an encapsulant may at least partly cover an array of a plurality of LEDs which may be arranged on a second surface of the carrier.

According to an embodiment of the present invention, the substrate may be flexible or rigid. A rigid substrate may be made from glass, quarts, sapphire and/or a polymer. A flexible substrate may be made from a polymer such as for example of poly imide. A rigid substrate provides strength and rigidly mounting of the at least one LED filament. A flexible substrate provides flexibility and flexible mounting of the at least one LED filament.

According to an embodiment of the present invention, the substrate is light transmissive such as translucent and preferably transparent to enable high light transmission through the substrate.

The encapsulant comprises a light scattering material. By the term "light scattering material", it is here meant a material, composition and/or substance which is configured to scatter and/or reflect light. The light scattering material does not convert light and does (substantially) not absorb light (at least less than 5%). For example, the light scattering material may comprise gas bubbles and/or scattering particles such as for example Al2O3, BaSO4, TiO2 and/or particles having a different.

The LED filament lamp comprises at least one LED filament. The at least one LED filament, in its turn, comprises an array of LEDs. By the term "array", it is here meant a linear arrangement or chain of LEDs, or the like, arranged in the LED filament(s). The LEDs may furthermore be arranged, mounted and/or mechanically coupled on/to a carrier e.g. a substrate of each LED filament, wherein the substrate is configured to support the LEDs.

The array of LEDs may comprise a luminescent converter. The luminescent converter at least partially covers the LEDs. The luminescent converter may also at least partly or fully cover a carrier which may carry the array of LEDs. The luminescent converter may also cover at least part of the first mayor surface of the carrier. The luminescent converter may also cover at least part of the second mayor surface of the carrier. The luminescent converter comprises a luminescent material. By the term "luminescent material", it is here meant a material, composition and/or substance which is configured to emit light under external energy excitation. For example, the luminescent material may an inorganic phosphor, organic phosphor and/or quantum dots/rods.

The LED filament(s) further comprises an encapsulant at least partially or fully enclosing the plurality of LEDs. By the term "encapsulant", it is here meant a material, element, arrangement, or the like, which is configured or arranged to at least partially surround, encapsulate and/or enclose the plurality of LEDs of the LED filament(s). The LED filament may further comprise a luminescent converter.

The LED filament lamp may have the feature that said increase and/or decrease in thickness of the encapsulant and/or concentration of the light scattering material in the encapsulant is gradual. The obtained effect is that the LED filament lamp provides an improved attractive and appealing light effect. The reason is that there are gradual changes in intensity along the LED filament length. Gradual means taking place or progressing slowly or by degrees, for example continuously or by small steps.

The LED filament lamp may have the feature that the LED filament comprises a luminescent converter. The luminescent converter at least partly covers the array of the plurality of LEDs. The luminescent converter is arranged between the encapsulant and the array of the plurality of LEDs. The luminescent converter is configured to at least partly convert LED light into converted light.

The LED filament lamp may have the feature that the luminescent converter is provided as a continuous layer over the array of the plurality of LEDs.

The LED filament lamp may have the feature that the plurality of LEDs are phosphor converted (pc) LEDs. The pc-LEDs may emit white light. For example, the LEDs may be blue LEDs comprising a yellow/green and a red phosphor for partially converting blue LED light into green/yellow light and red light. For example, the LEDs may be UV LEDs comprising a blue, yellow/green and a red phosphor for partially/fully converting UV LED light into blue light and green/yellow light and red light.

The LED filament lamp may have the feature that the plurality of LEDs are colored LEDs. The colored LEDs may, in total, emit white light. For example, the plurality of LEDs may comprise blue, green and red LEDs.

The LED filament lamp may have the feature that the LED filament comprises a plurality of subsequent increases and decreases in thickness of the encapsulant and/or concentration of the light scattering material in the encapsulant which form a plurality of maxima in said thicknesses and/or said concentrations along LED filament length. The obtained effect is that the LED filament lamp provides an improved attractive and appealing light effect. The reason is that there are multiple changes in intensity along the LED filament length.

The maxima may have a maxima height and between the maxima there may be minima which have a minima height. The maxima height is preferably at least 1.3 times the minima height, more preferably the maxima height is preferably at least 1.5 times the minima height, most preferably the maxima height is preferably at least 1.7 times the minima-height such as for example 2 times the minima height.

The maxima may have a maxima concentration and between the maxima there may be minima which have a minima concentration. The maxima concentration is preferably at least 1.3 times the minima concentration, more preferably the maxima concentration is preferably at least 1.5 times the minima concentration, most preferably the maxima concentration is preferably at least 1.7 times the minima concentration such as for example 2 times the minima concentration.

The LED filament lamp may have the feature that the distance between said maxima is varied along the LED filament length. The obtained effect is that the LED filament lamp provides an improved attractive and appealing light effect. The reason is that the distances between high intensity areas are different.

The LED filament lamp may have the feature that the distance between said maxima (M) is randomly varied along the LED filament length. The obtained effect is that the LED filament lamp provides an improved attractive and appealing light effect. The reason is that the distances between high intensity areas are different and random.

The LED filament lamp may have the feature that said maxima have different thicknesses of the encapsulant and/or concentrations of the light scattering material in the encapsulant along LED filament length. The obtained effect is that the LED filament lamp provides an improved attractive and appealing light effect. The reason is that the high and low intensity areas have a different intensity.

The LED filament lamp may have the feature that the distance between said maxima is varied along the LED filament length, and wherein said maxima have different thicknesses of the encapsulant and/or concentrations of the light scattering material in the encapsulant along the LED filament length. The obtained effect is that the LED filament lamp provides a further improved attractive and appealing light effect. The reason is that a combination of both measures is used.

The LED filament lamp may have the feature that the number of said maxima is at least 5. The obtained effect is that the LED filament lamp provides an improved attractive and appealing light effect. The reason is that there are multiple high and low intensity areas.

The LED filament lamp may have the feature that the thickness of the encapsulant and/or concentration of the light scattering material in the encapsulant of at least three maxima are different. The obtained effect is that the LED filament lamp provides an improved attractive and appealing light effect. Thus the LED filament lamp is more attractive/pleasant to look at. The reason is that there are multiple high and low intensity areas which have a different intensity. This leads to a generation of light which resemble or mimic a sparkling flame of a candle. More preferably, the LED filament lamp may have the feature that the thickness of the encapsulant and/or concentration of the light scattering material in the encapsulant of at least five maxima are different.

The LED filament lamp may have the feature that the LED filament may have at least four maxima M and at least three different distances between said maxima.

The LED filament lamp may have the feature that the LED filament may have at least three maxima M which have different thicknesses TL of the encapsulant 104 and/or concentrations CL of the light scattering material 105 in the encapsulant 104 along the LED filament length L.

The LED filament lamp may have the feature that at least one of the thickness of the encapsulant and the concentration of the light scattering material in the encapsulant increases and/or decreases non-linearly. The obtained effect is that the LED filament lamp provides an improved attractive and appealing light effect. The reason is that non-linear intensity profiles are obtained along the length of the LED filament.

The LED filament lamp may have the feature that the at least one LED filament comprises a first LED filament and a second LED filament. The obtained effect is that the LED filament lamp provides an improved attractive and appealing light effect. The reason is that multiple LED filaments which provide intensity profiles along the length of the LED filaments are used.

The LED filament lamp may have the feature that the first LED filament and the second LED filament are mutually different in thickness and/or concentration profile. The obtained effect is that the LED filament lamp provides an improved attractive and appealing light effect. The reason is that different LED filaments provides different intensity profiles along the length of the LED filament.

The LED filament lamp may have the feature that the LED filament lamp further comprising a control unit coupled to the first LED filament and the second LED filament and is configured to individually control the current supply to the first LED filament and the second LED filament. The obtained effect is that the LED filament lamp provides an improved attractive and appealing light effect. The reason is that different LED filaments provides different intensity profiles because both filaments are providing a different luminous flux.

The luminaire comprises a reflector and the LED filament lamp according to the invention, wherein the LED filament lamp is at least partly arranged inside the reflector. The obtained effect is a decorative luminaire which provides an improved attractive and appealing light effect. The reason is that the light is the LED filaments are visible but part of the light is redirected by the reflector to a certain direction e.g. a table or floor.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1A:
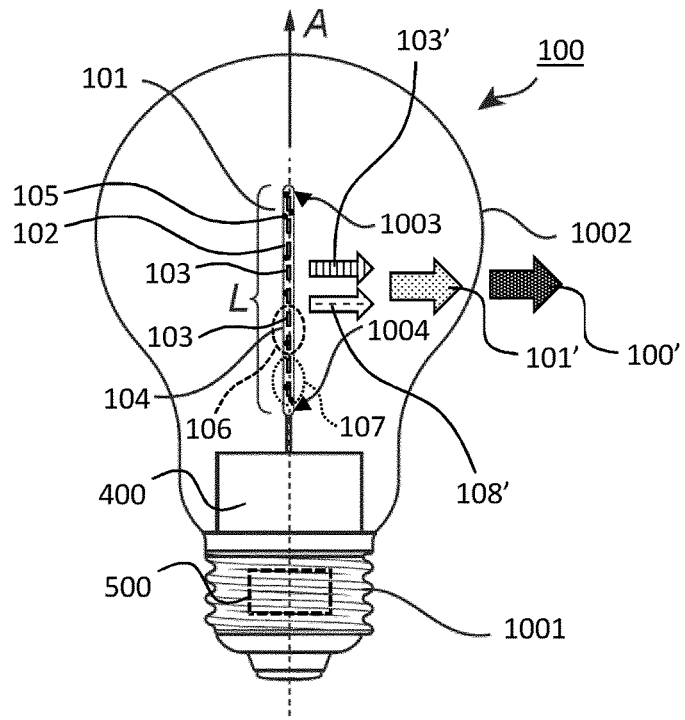
FIG. 1a shows a schematic side-view of a LED filament lamp according to an embodiment of the present invention.

The schematic drawings are not necessarily on scale.

The same features having the same function in different figures are referred to the same references.

DETAILED DESCRIPTION

FIG. 1 shows schematic illustrations of a LED filament lamp 100, a filament 101 and a carrier 1005 which comprises an array 102 of a plurality of LEDs 103 according to an embodiment of the present invention. FIG. 1a shows a schematic side-view of a LED filament lamp 100 according to an embodiment of the present invention. FIG. 1b shows a schematic top-view of a carrier 1005 comprising an array of a plurality of LEDs 103 according to an embodiment of the present invention. FIG. 1c shows a schematic cross-section of a LED filament 101 according to an embodiment of the present invention. FIG. 1d shows a schematic cross-section of a LED filament 101 according to an embodiment of the present invention. FIG. 1e shows a schematic side-view of a LED filament 101 according to an embodiment of the present invention. FIG. 1f shows a schematic side-view of a LED filament 101 according to an embodiment of the present invention. As depicted in FIG. 1, the LED filament lamp 100 provides LED filament lamp light 100' and comprises at least one LED filament 101 which has a LED filament length L. The at least one LED filament 101 provides LED filament light 101' and comprises an array 102 of a plurality of LEDs 103 and an encapsulant 104. The array 102 of a plurality of LEDs 103 provide LED light 103' and extend along the LED filament length L. The encapsulant 104 at least partially encloses the plurality of LEDs 103. The encapsulant 104 comprises a light scattering material 105. At least one of (i) the thickness TL of the encapsulant 104 (see FIG. 1c), and (ii) the concentration CL of the light scattering material 105 in the encapsulant 104 (see FIG. 1d), along the LED filament length L increases over at least two adjacent first LEDs 106 and decreases over at least two adjacent second LEDs 107 different from the at least two adjacent first LEDs 106. The thickness TL and/or concentration CL firstly increases and secondly decreases at least along a portion of the LED filament length L.

As depicted in FIG. 1a, the LED filament may comprise a base 1001. The base 1001 may be mechanically and/or electrically connected to a socket e.g. of a luminaire 200. As depicted in FIG. 1a, the LED filament may comprise an envelope 1002. The envelope 1002 is at least partly enveloping the at least one LED filament 101. The envelope 1002 may be translucent and preferably transparent. The LED filament lamp 100 may comprise a longitudinal axis A. The envelope and/or base may be arranged along the longitudinal axis A. The LED filament lamp may comprise a controller 400 and/or driver 500. The driver 500 may be electrically connected to the at least one LED filament 101. The driver 500 may be electrically connected to the controller 400. The controller may be connected to the at least one LED filament 101. The driver 500 and/or controller 400 may be electrically connected to the base 1001. The LED filament may comprise a luminescent material for at least partly convert LED light 103' into converted light 108'. The LED filament light may comprise the LED light 103' and/or the converted light 108'. The LED filament lamp light 100' comprises the LED filament light 101'. The LED filament may extend from a first LED filament end 1003 to a second LED filament end 1004.

Figure 1B:
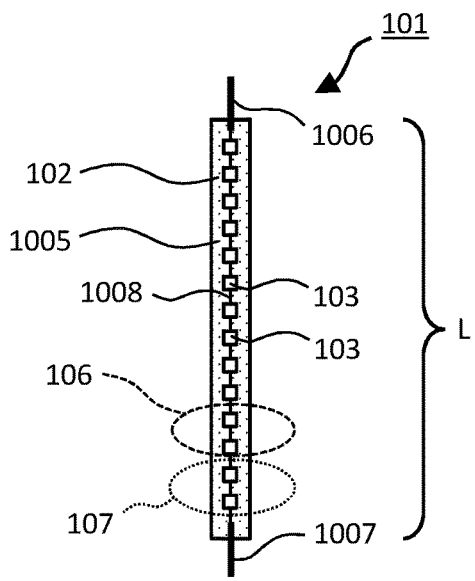
FIG. 1b shows a schematic top-view of a carrier comprising an array of a plurality of LEDs according to an embodiment of the present invention.

As depicted in FIG. 1b, the array 102 of a plurality of LEDs 103 may be arranged on a carrier 1005 e.g. a substrate. The carrier 1005 may be rigid or flexible. The carrier 1005 may comprise an electric track and/or wires 1008. The electric track and/or wires 1008 are electrically connecting the LEDs. The carrier may have a first outer electrical contact 1006 and a second outer electrical contact 1007. The first outer electrical contact 1006 and the second outer electrical contact 1007 may be connected to the control 400 and/or driver 500.

Figure 1C:
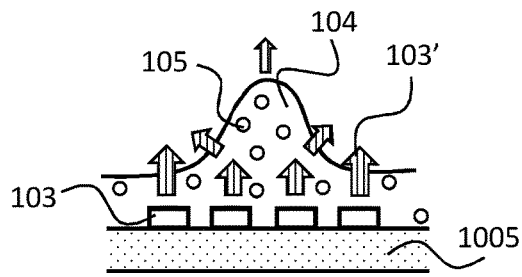
FIG. 1c shows a schematic cross-section of a LED filament according to an embodiment of the present invention.

As depicted in FIG. 1*c*, the increase and decrease in thickness (TL) of the encapsulant (104) is gradual.

Figure 1D:
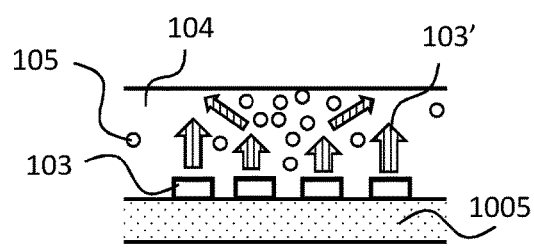
FIG. 1d shows a schematic cross-section of a LED filament according to an embodiment of the present invention.

As depicted in FIG. 1*d*, the increase and decrease in concentration (CO of the light scattering material (105) in the encapsulant (104) is gradual.

Figures 1E, 1F:
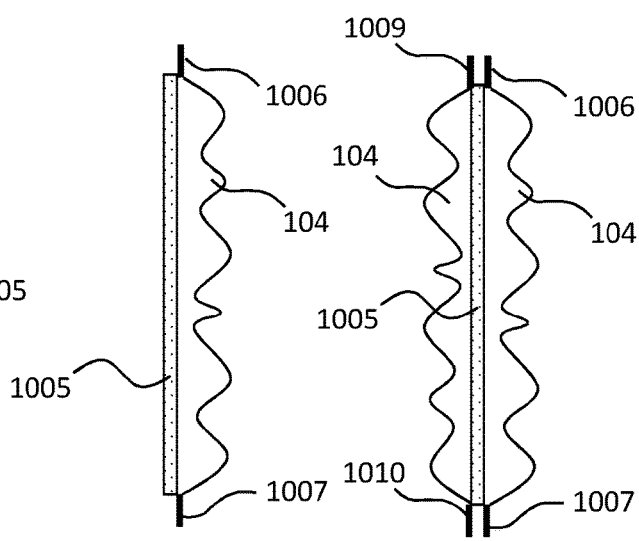
FIG. 1e shows a schematic side-view of a LED filament according to an embodiment of the present invention.
FIG. 1f shows a schematic side-view of a LED filament according to an embodiment of the present invention.

As depicted in FIGS. 1*e* and 1*f*, the LED filament may have a plurality of LEDs 103 and an encapsulant 104 only at one (i.e. a first) surface of the carrier 1005 (FIG. 1*e*). The at least one LED filament 101 may also comprise a plurality of LEDs 103 and/or an encapsulant 104 on both (i.e. a first and second major) surfaces of the carrier 1005 (FIG. 1*f*). Thus the at least one LED filament 101 may also comprise on a second surface an encapsulant 104 but no LEDs. In such a configuration the carrier 1005 is preferably translucent and more preferably transparent. In case the at least one LED filament 101 comprises a plurality of LEDs 103 on the first surface of the carrier 1005 and a plurality of LEDs 103 on the second surface of the carrier 1005, the LED filament may comprise more than 2 outer electrical contacts e.g. in addition of a first outer electrical contact 1006 and a second outer electrical contact 1007 also a third outer electrical contact 1009 (and a fourth outer electrical contact 1010). The variations in encapsulant thickness and/or concentration of the light scattering material along the length of the LED filament may refer to the encapsulant and light scattering material in the encapsulant on the first and/or second surface of the carrier. The variations in encapsulant thickness and/or concentration of the light scattering material along the length of the LED filament on the first surface of the carrier may be different from the variations in encapsulant thickness and/or concentration of the light scattering material along the length of the LED filament on the second surface of the carrier.

Figure 2A:
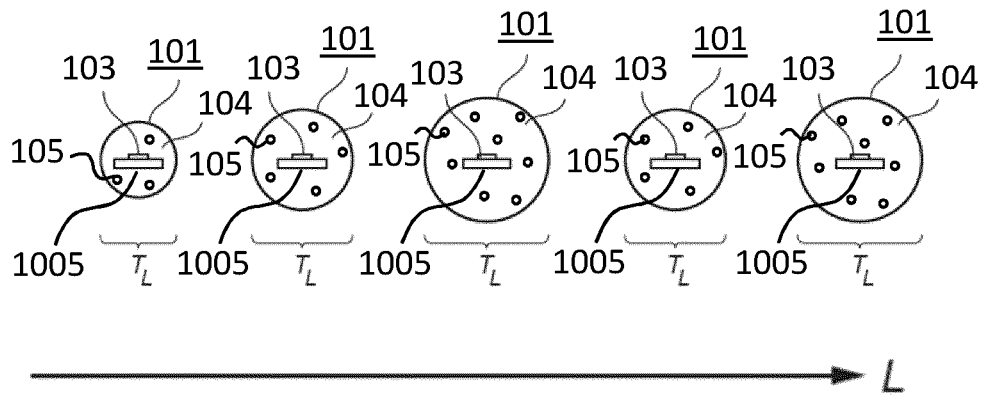
FIG. 2a-b show schematic cross-sections of LED filaments according to an embodiment of the present invention.

FIG. 2 show a schematic cross-sections of LED filaments 101 according to an embodiment of the present invention. FIG. 2*a* shows cross-sections of a LED filament 101 as function of the length L of the LED filament 101. The cross-sections show a carrier 1005 and a plurality of LEDs 103 arranged on the carrier 1005. The plurality of LEDs 103 and carrier 1005, e.g., substrate are covered by an encapsulant 104. The encapsulant 104 comprises light scattering material 105. As depicted in FIG. 2*a*, the thickness TL of the encapsulant 104, along the LED filament length L increases over at least two adjacent first LEDs 106 and decreases over at least two adjacent second LEDs 107 different from the at least two adjacent first LEDs 106. The thickness TL firstly increases and secondly decreases at least along a portion of the LED filament length L. In case the encapsulant 104 is fully enclosing the LED filament it also has the reference 104.

Figure 2B:
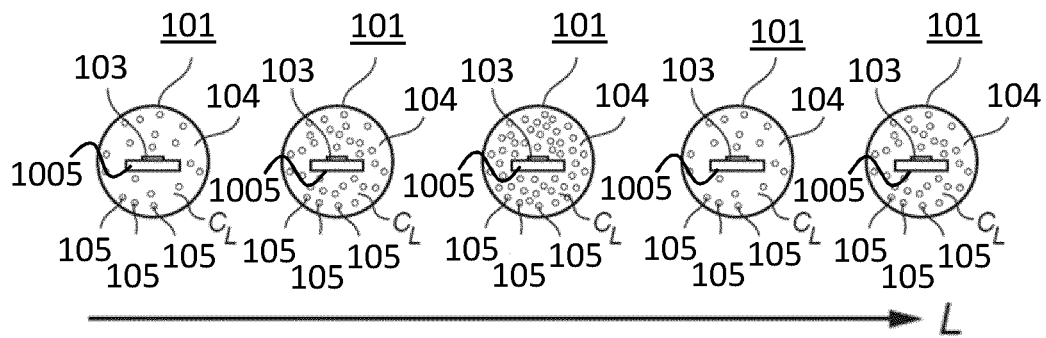

FIG. 2*b* shows cross-sections of a LED filament 101 as function of the length L of the LED filament 101. The cross-sections show a carrier 1005 and a plurality of LEDs 103 arranged on the carrier 1005. The plurality of LEDs 103 and carrier 1005, e.g. substrate, are covered by an encapsulant 104. The encapsulant 104 comprises light scattering material 105. As depicted in FIG. 2*a*, the concentration CL of the light scattering material 105 in the encapsulant 104, along the LED filament length L increases over at least two adjacent first LEDs 106 and decreases over at least two adjacent second LEDs 107 different from the at least two adjacent first LEDs 106. The concentration CL firstly increases and secondly decreases at least along a portion of the LED filament length L.

Figure 3A:
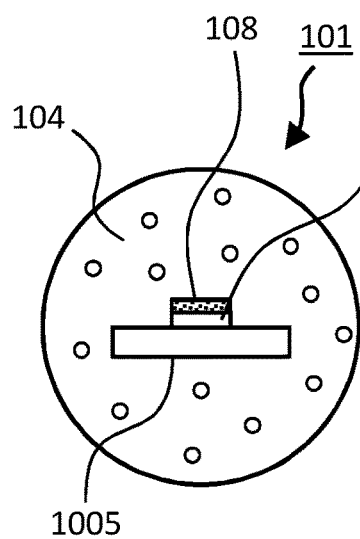
FIG. 3a-c show schematic cross-sections of LED filaments according to an embodiment of the present invention.
Figure 3B:
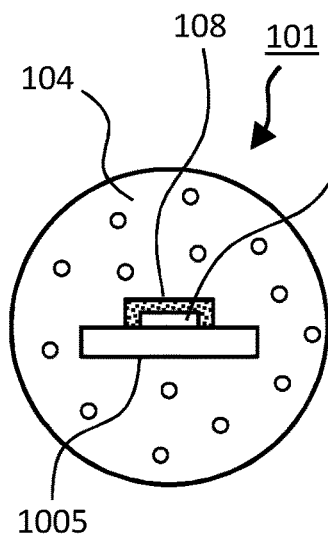
Figure 3C:
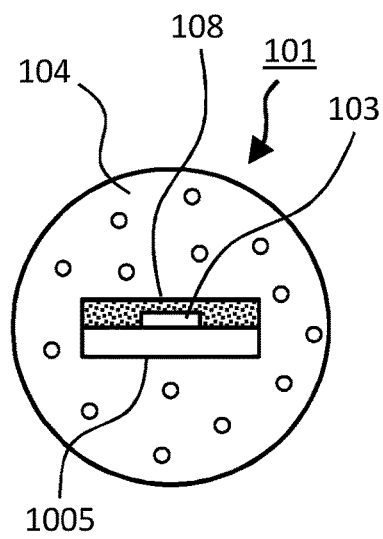
Figure 3D:
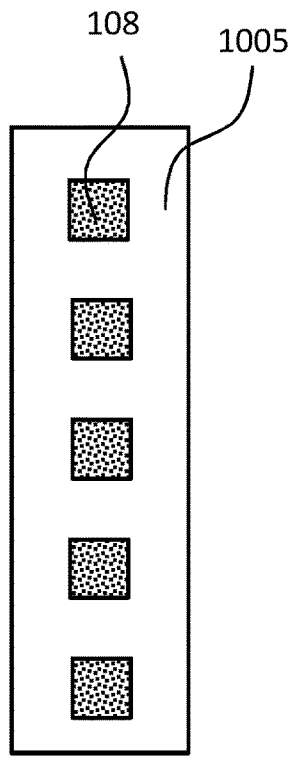
FIG. 3d-f show schematic top-views of carriers comprising an array of a plurality of LEDs according to an embodiment of the present invention.
Figure 3E:
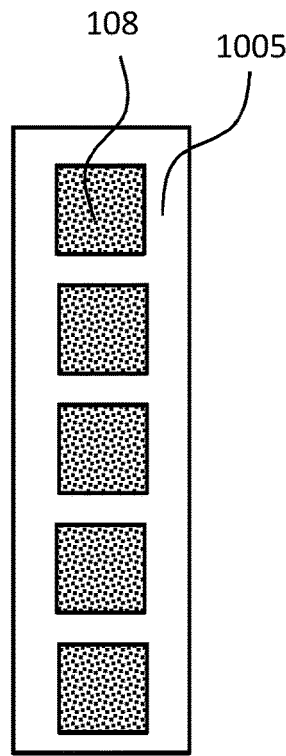
Figure 3F:
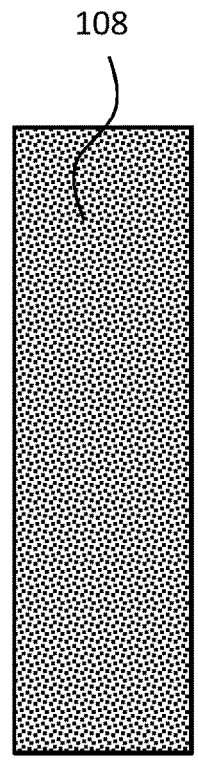

FIG. 3*a-c* show a schematic cross-sections of LED filaments according to an embodiment of the present invention. FIG. 3*d-f* show a schematic top-views of carriers 1005 comprising an array 102 of a plurality of LEDs 103 according to an embodiment of the present invention. As depicted in FIG. 3*a-c*, the LED filament 101 comprises a luminescent converter 108. The luminescent converter 108 at least partly covering the array 102 of the plurality of LEDs 103. The luminescent converter 108 is arranged between the encapsulant 104 and the array 102 of the plurality of LEDs 103. The luminescent converter 108 is configured to at least partly (i.e. partly or fully) convert LED light 103' into converted light 108'.

As depicted in FIG. 3*a-f*, the luminescent converter 108 may only cover the light exit of the plurality of LEDs 103 (FIGS. 3*a* and *d*), or may only cover the light exit and sides of the plurality of LEDs 103 (FIGS. 3*b* and 3*e*).

As depicted in FIGS. 3*c* and 3*f*, the luminescent converter 108 may be provided as a continuous layer over the array 102 of the plurality of LEDs 103 (and the surface of the carrier 1005).

Figure 4A:
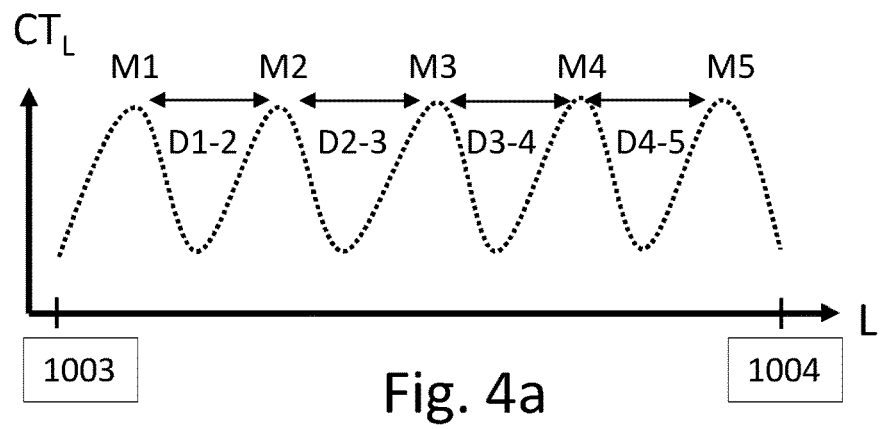
FIG. 4a-d show schematic concentration and/or thickness profiles according to an embodiment of the present invention.

FIG. 4*a-d* show schematic concentration and/or thickness profiles (as function of the LED filament length L) according to an embodiment of the present invention. As depicted in FIG. 4*a*, the LED filament 101 may comprise a plurality of subsequent increases and decreases in thickness TL of the encapsulant 104 and/or concentration CL of the light scattering material 105 in the encapsulant 104 forming a plurality of M maxima in said thicknesses TL and/or said concentrations $C_L$ along the LED filament length L.

Figure 4B:
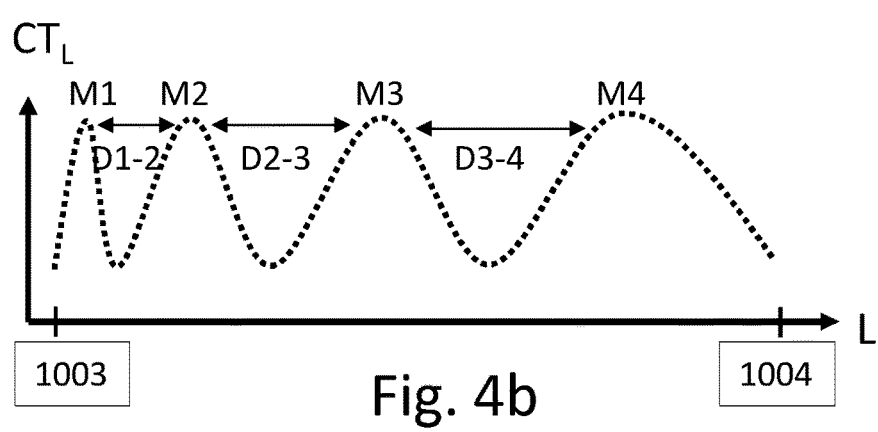

As depicted in FIG. 4*b*, the distance D between said maxima M may be varied along the LED filament length (L) e.g. increase (see e.g. D1-2, D2-3, D3-4). The LED filament may have at least four maxima M and at least three different distances between said maxima.

Figure 4C:
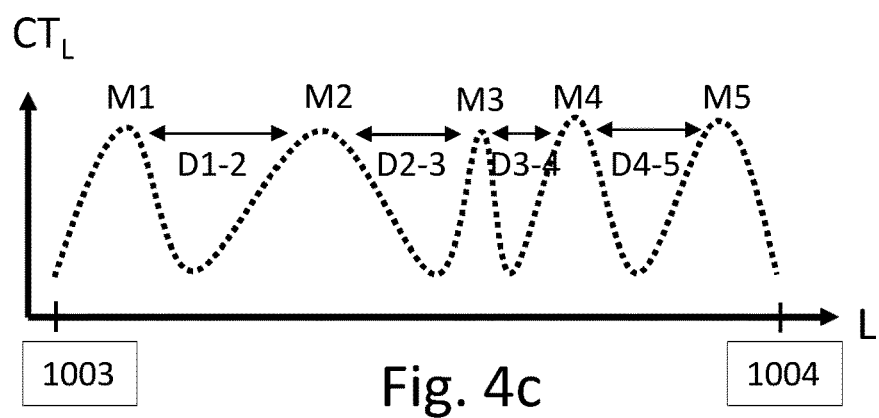

As depicted in FIG. 4*c*, the distance D between said maxima M may be randomly varied along the LED filament length L (see e.g. D1-2, D2-3, D3-4, D4-5).

Figure 4D:
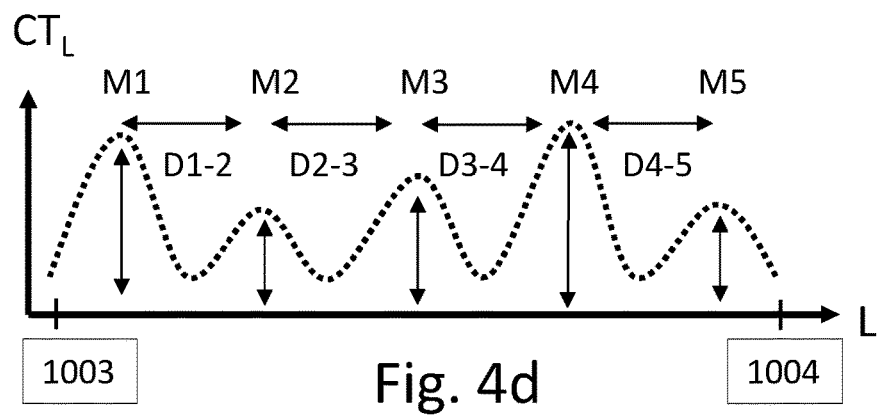

As depicted in FIG. 4*d*, said maxima M may have different thicknesses TL of the encapsulant 104 and/or concentrations CL of the light scattering material 105 in the encapsulant 104 along the LED filament length L (see M1, M2, M3, M4, M5). The LED filament may have at least three maxima M which have different thicknesses TL of the encapsulant 104 and/or concentrations CL of the light scattering material 105 in the encapsulant 104 along the LED filament length L.

As depicted in FIG. 4*d*, the number of said maxima M is at least 5 such as 5 (see M1, M2, M3, M4, M5).

As depicted in FIG. 4*d*, the thickness TL of the encapsulant 104 and/or concentration CL of the light scattering material 105 in the encapsulant 104 of at least three maxima M are different (see M1, M2, M3, M4, M5).

As depicted in FIG. 4*d*, at least one of the thickness TL of the encapsulant 104 and the concentration CL of the light scattering material 105 in the encapsulant 104 increases and/or decreases non-linearly.

Figure 5:
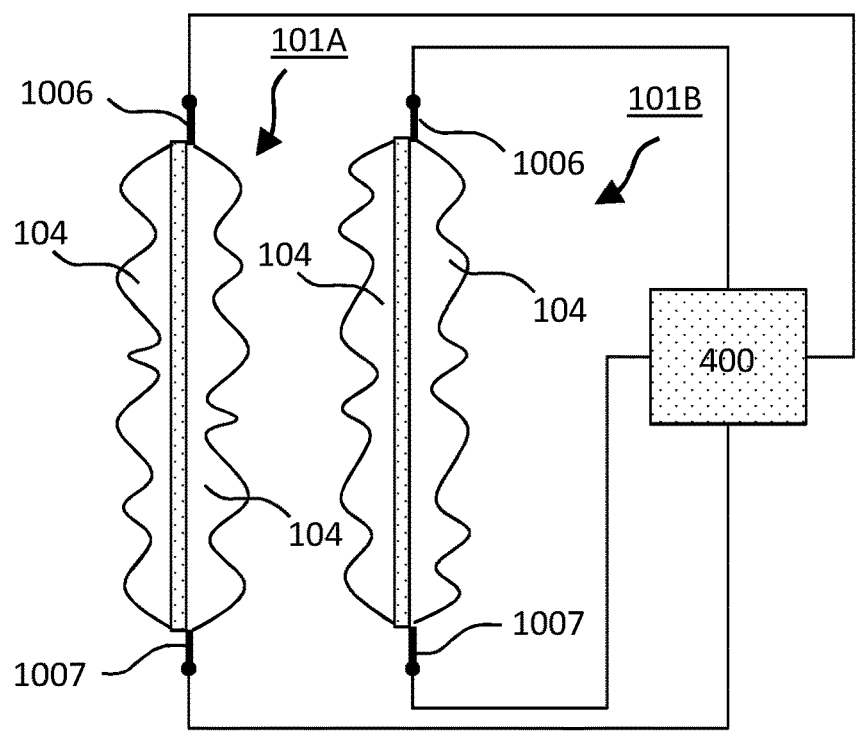
FIG. 5 shows a side-view two LED filaments according to an embodiment of the present invention.

FIG. 5 shows a side-view two LED filaments 101 according to an embodiment of the present invention. As depicted in FIG. 5, the at least one LED filament 101 comprises a first LED filament 101A and a second LED filament 101B. In other embodiments, the at least one LED filament 101 comprises three, four, five, six, seven, eight, nine, ten, eleven or twelve LED filaments 101. As depicted in FIG. 5, the first LED filament 101A and the second LED filament 101B are mutually different in thickness TL and/or concentration CL profile.

As depicted in FIG. 5, the LED filament lamp 100 (not shown) further comprising a control unit 400 coupled to the first LED filament 101A and the second LED filament 101B and is configured to individually control the current supply to the first LED filament 101A and the second LED filament 101B.

Figure 6:
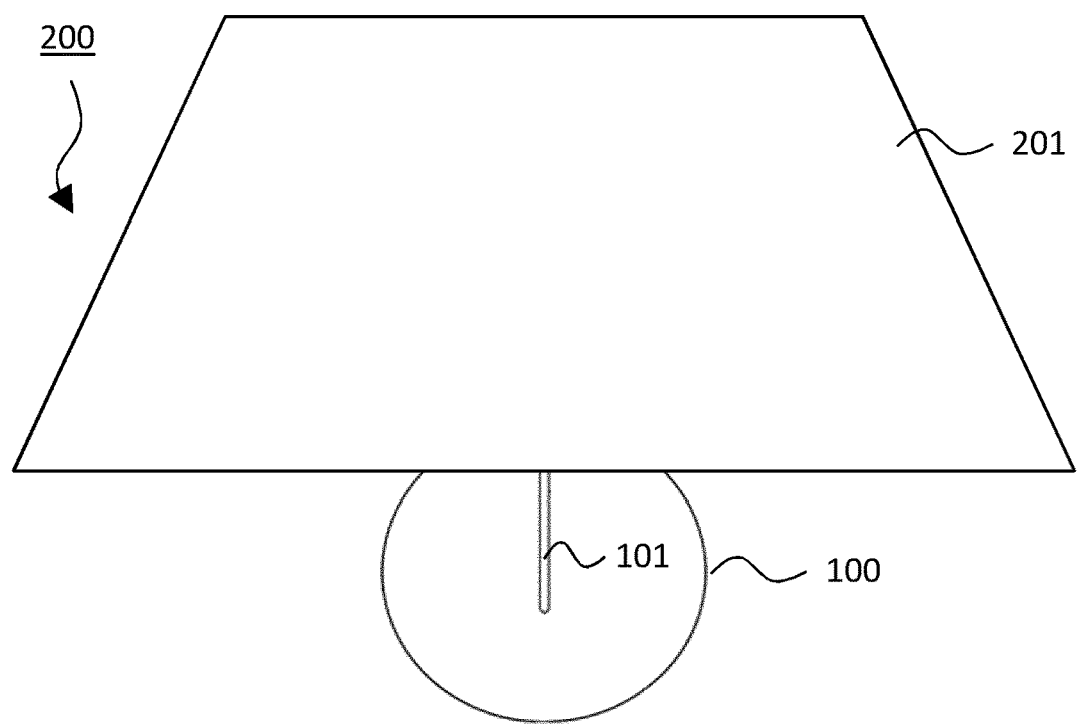
FIG. 6 shows a luminaire comprising a reflector and the LED filament lamp according to an embodiment of the present invention.

As depicted in FIG. 6, a luminaire 200 comprises a reflector 201 and the LED filament lamp 100, wherein the LED filament lamp 100 is at least partly arranged inside the reflector 201.

The LED filament lamp 100 may be configured to provide white light. The LED filament 101 may be configured to provide white light. The term white light herein, is known to the person skilled in the art and relates to white light having a correlated color temperature (CCT) between about 2000 K and 20000 K. In an embodiment the CCT is between 2100 K and 6000K. Usually, for general lighting, the CCT is in the range of about 2200K to 6500K. Preferably, it relates to white light having a color point within about 15, 10 or 5 SDCM (standard deviation of color matching) from the BBL (black body locus). Preferably, it relates to white light having a color rendering index (CRI) of at least 70 to 75, for general lighting at least 80 to 85.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light emitting diode, LED, filament lamp providing LED filament lamp light and comprising at least one LED filament having a LED filament length (L) extending from a first end to a second end, wherein the at least one LED filament provides LED filament light and comprises:

an array of a plurality of LEDs providing LED light and extending along the LED filament length (L), and an encapsulant at least partially enclosing the plurality of LEDs, wherein the encapsulant comprises a light scattering material; and wherein in the direction from the first end to the second end at least one of (i) the thickness ($T_L$) of the encapsulant, and (ii) the concentration ($C_L$) of the light scattering material in the encapsulant, along the LED filament length (L) increases over at least two adjacent first LEDs and decreases over at least two adjacent second LEDs different from the at least two adjacent first LEDs, and wherein the thickness ($T_L$) and/or concentration ($C_L$) firstly increases and secondly decreases at least along a portion of the LED filament length (L), wherein the LED filament comprises a plurality of subsequent increases and decreases in thickness ($T_L$) of the encapsulant and/or concentration ($C_L$) of the light scattering material in the encapsulant forming a plurality of (M) maxima in said thicknesses ($T_L$) and/or said concentrations ($C_L$) along the LED filament length (L), and wherein the thickness ($T_L$) of the encapsulant and/or concentration ($C_L$) of the light scattering material in the encapsulant of at least three maxima (M) are different;

wherein said increase and/or decrease in thickness ($T_L$) of the encapsulant and/or concentration ($C_L$) of the light scattering material in the encapsulant is gradual;

wherein at least one of the thickness ($T_L$) of the encapsulant and the concentration ($C_L$) of the light scattering material in the encapsulant increases and/or decreases non-linearly;

wherein (i) the maxima have a maxima height and between the maxima are minima which have a minima height, the maxima height is at least 1.7 times the minima height, and/or (ii) the maxima have a maxima concentration and between the maxima there are minima which have a minima concentration, the maxima concentration is at least 1.7 times the minima concentration.

2. The LED filament lamp according to claim 1, wherein the LED filament comprises a luminescent converter, the luminescent converter at least partly covering the array of the plurality of LEDs, the luminescent converter is arranged between the encapsulant and the array of the plurality of LEDs, the luminescent converter is configured to at least partly convert LED light into converted light.

3. The LED filament lamp according to claim 2, wherein the luminescent converter is provided as a continuous layer over the array of the plurality of LEDs.

4. The LED filament lamp according to claim 1, wherein the light scattering material does not convert light.

5. The LED filament lamp according to claim 1, wherein the distance (D) between said maxima (M) is varied along the LED filament length (L).

6. The LED filament lamp according to claim 5, wherein the distance (D) between said maxima (M) is randomly varied along the LED filament length (L).

7. The LED filament lamp according to claim 1, wherein said maxima (M) have different thicknesses ($T_L$) of the encapsulant and/or concentrations ($C_L$) of the light scattering material in the encapsulant along the LED filament length (L).

8. The LED filament lamp according to claim 1, wherein the number of said maxima (M) is at least 5.

9. The LED filament lamp according to claim 1, wherein the distance (D) between said maxima (M) is varied along the LED filament length (L), and wherein said maxima (M) have different thicknesses ($T_L$) of the encapsulant and/or concentrations ($C_L$) of the light scattering material in the encapsulant along the LED filament length (L).

10. The LED filament lamp according to claim 1, wherein the at least one LED filament comprises a first LED filament and a second LED filament.

11. The LED filament lamp according to claim 10, wherein the first LED filament and the second LED filament are mutually different in thickness ($T_L$) and/or concentration ($C_L$) profile.

12. The LED filament lamp according to claim 10, further comprising a control unit coupled to the first LED filament and the second LED filament and configured to individually control the current supply to the first LED filament and the second LED filament.

13. A luminaire comprising a reflector and the LED filament lamp according to claim 1, wherein the LED filament lamp is at least partly arranged inside the reflector.

* * * * *